United States Patent
Lee et al.

(10) Patent No.: US 8,374,043 B2
(45) Date of Patent: Feb. 12, 2013

(54) SENSE AMPLIFIER AND SEMICONDUCTOR MEMORY DEVICE USING IT

(75) Inventors: Hyun-Bae Lee, Hwaseong-si (KR); Sang-Woong Shin, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 272 days.

(21) Appl. No.: 12/453,199

(22) Filed: May 1, 2009

(65) Prior Publication Data

US 2010/0128545 A1    May 27, 2010

(30) Foreign Application Priority Data

Nov. 27, 2008    (KR) .................. 10-2008-0118670

(51) Int. Cl.
*G11C 7/02*    (2006.01)
(52) U.S. Cl. .................................... 365/207
(58) Field of Classification Search ............. 365/189.15, 365/190, 205, 207; 327/51, 52
See application file for complete search history.

(56) References Cited

U.S. PATENT DOCUMENTS

| | | | | |
|---|---|---|---|---|
| 4,477,736 A * | 10/1984 | Onishi ........................... | 327/543 |
| 4,758,749 A * | 7/1988 | Rapp ................................ | 327/51 |
| 5,126,974 A * | 6/1992 | Sasaki et al. ................... | 365/207 |
| 6,009,032 A * | 12/1999 | Lin et al. ......................... | 365/208 |
| 6,088,278 A * | 7/2000 | Porter et al. .................... | 365/208 |
| 6,104,655 A * | 8/2000 | Tanoi et al. .................... | 365/205 |
| 6,191,989 B1 * | 2/2001 | Luk et al. ........................ | 365/207 |
| 6,272,056 B1 * | 8/2001 | Ooishi ...................... | 365/189.18 |
| 6,424,577 B2 * | 7/2002 | Sim ........................... | 365/189.05 |
| 6,738,302 B1 | 5/2004 | Parris et al. | |
| 7,058,121 B1 * | 6/2006 | Kim et al. ........................ | 375/219 |
| 7,616,513 B1 * | 11/2009 | Peng et al. ...................... | 365/207 |
| 2002/0118047 A1 * | 8/2002 | Sim ................................. | 327/52 |
| 2002/0179418 A1 * | 12/2002 | Guldenfels ................... | 198/853 |
| 2006/0291313 A1 * | 12/2006 | Kwon ........................... | 365/207 |
| 2008/0048728 A1 * | 2/2008 | Hong et al. ..................... | 327/51 |
| 2009/0010086 A1 * | 1/2009 | Hong et al. .................... | 365/207 |

FOREIGN PATENT DOCUMENTS

KR    10-2003-0002504    1/2003

* cited by examiner

*Primary Examiner* — Douglas King
(74) *Attorney, Agent, or Firm* — Harness, Dickey & Pierce, P.L.C.

(57) ABSTRACT

A sense amplifier having a pre-amplifier and a main-amplifier is disclosed. The pre-amplifier is connected to paired data line, senses and amplifies data on the paired data line using voltage mode and outputting a pair of differential signal. The main-amplifier is connected to the paired data line, senses and amplifies data on the paired data line using current mode and generating a first amplified signal, senses and amplifies the first amplified signal using voltage mode in response to the pair of differential signal, and outputting an amplified data.

16 Claims, 11 Drawing Sheets

SENSE AMPLIFIER AND SEMICONDUCTOR MEMORY DEVICE USING IT

CROSS-REFERENCE TO RELATED APPLICATION

This application claims the benefit of Korean Patent Application No. 10-2008-0118670, filed Nov. 27, 2008, the contents of which are incorporated herein by reference in their entirety.

BACKGROUND

1. Field

Example embodiments relate to a sense-amplifier, and more particularly, to a sense amplifier sensing and amplifying data on a pair of data line, a semiconductor memory device having thereof and a memory system having the semiconductor memory device.

2. Description of Related Art

In general, a semiconductor memory device like DRAM, SRAM includes a memory core, a data sense amplifier, and data output/input unit. The memory device outputs data to external device that stored at memory cells in the memory core through the data sense amplifier. As the memory device has been required to have more density, data line between the memory core and the data sense amplifier got longer and big load capacitance. So, most memory devices have a hierarchical data line structure, having a local data line and a global data line between the memory cell and the data sense amplifier. The local data line is a data line between bit line sense amplifier and a local sense amplifier. The global data line is a data line between the local sense amplifier and a global sense amplifier. The local sense amplifier is located inside the memory core. The global sense amplifier is located outside the memory device. So, the global data line is longer than the local data line in general For read operation of the memory device, when the memory cell is selected, first data stored in the memory cell is sensed and amplified by the bit line sense amplifier and transferred to the local data line. Then data on the local data line is sensed and amplified by the local sense amplifier and transferred to the global data line. After that data on the global data line is sensed and amplified by the global sense amplifier and transferred to a data output unit. Finally the output data unit outputs data to an external device, like a memory controller.

There has been used two type of the global sense amplifier amplifying data on the global data line having small signal. Voltage-mode sense amplifier has low-power consumption but relatively low-speed operation. Current-mode sense amplifier has relatively high-speed operation but relatively high-power consumption.

SUMMARY

The inventive concept provides a sense amplifier capable of sensing and amplifying data signal on data line with high-speed and low-power consumption and a semiconductor memory device using the sense amplifier.

According to example embodiments, a sense amplifier includes a pre-amplifier connected to a pair of data line that senses and amplifies data on the pair of data line using voltage mode and outputs a pair of differential signal and a main-amplifier connected to the pair of data line that senses and amplifies data on the pair of data line using current mode and generates a first amplified signal, senses and amplifies the first amplified signal using voltage mode in response to the pair of differential signal, and outputs a pair of amplified data.

The pre-amplifier includes a voltage down converting part connected to the pair of data line and generating internal voltage having lower than the voltage of the pair of data line and an amplifying part configured to amplify the internal voltage and outputting the pair of differential signals.

The amplifying part includes cross-coupled MOS transistors including a first MOS transistor connected to the first diode connected MOS transistor and a second MOS transistor connected to the second diode connected MOS transistor and output the pair of differential internal signal respectively using a negative impedance converting operation.

The main-amplifier includes a current supplying part configured to supply to the main-amplifier and the pair of data line, a current amplifying part connected to the pair of data line and generating the first amplified signal by sensing and amplifying the data of the pair of data line using current mode, and a voltage amplifying part receiving the pair of differential signal and amplifying the first amplified signal using voltage mode and outputting the pair of amplified data.

The current amplifying part includes cross-coupled MOS transistors that sense and amplify data on the pair of data line using current mode with positive feedback operation. The voltage amplifying part includes MOS transistors that sense the pair of differential signal and amplify the first amplified signal and output the amplified data.

According to other example embodiments, a sense amplifier for a pair of data line includes a current amplifying part connected to the pair of data line, sensing and amplifying data on the pair of data line with current mode and outputting a first amplified signal and a voltage amplifying part connected to the pair of data line, sensing data of the pair of data line and amplifying the first amplified signal with voltage mode and outputting an amplified data. Also the sense amplifier for a pair of data line further includes a current supplying part configured to supply to the sense amplifier and the pair of data line. The current amplifying part includes MOS transistors using positive feedback operation.

According to other example embodiments, a semiconductor memory device includes a memory core including at least one memory cell, a pair of data line coupled to at least one memory cell, and a sense amplifier connected to the pair of data line that having a pre-amplifier connected to a pair of data line, sensing and amplifying data of the pair of data line using voltage mode and outputting a pair of differential signal and a main-amplifier connected to the pair of data line, sensing and amplifying data of the pair of data line using current mode and generating a first amplified signal, sensing the pair of differential signal and amplifying the first amplified signal using voltage mode, and outputting a pair of amplified data.

The memory core includes a bit line sense amplifier connected to the memory cell and a local sense amplifier connected to the bit line sense amplifier through a column selector and a pair of local data line and connected to the sense amplifier through the pair of data line. The pair of data line is directly connected to the pre-amplifier and the main-amplifier.

BRIEF DESCRIPTION OF THE DRAWINGS

Example embodiments will be more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Detailed example embodiments are disclosed herein. However, specific structural and/or functional details disclosed herein are merely representative for purposes of describing example embodiments. The claims, however, may be embodied in many alternate forms and should not be construed as limited to only example embodiments set forth herein.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless express so defined herein.

Figure 1:
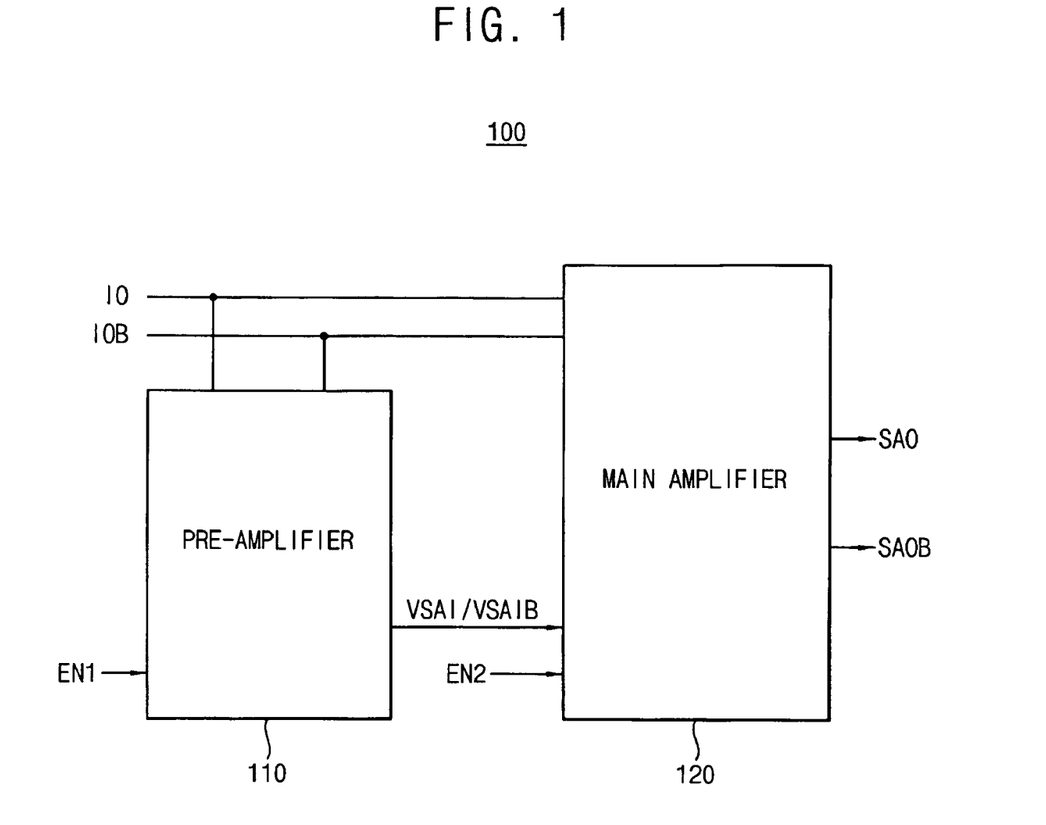
FIG. 1 shows a block diagram of a sense amplifier in accordance with an exemplary embodiment.

FIG. 1 shows a block diagram of a sense amplifier in accordance with an exemplary embodiment.

Referring to FIG. 1, the sense amplifier 100 includes a pre-amplifier 110 and a main-amplifier 120.

The pre-amplifier 110 senses and amplifies data on a pair of data line IO, IOB with voltage mode and outputs a pair of differential signal VSA1, VSA1B. The main-amplifier 120 senses and amplifies data on the pair of data line IO, IOB with current mode with the pre-amplifier 110 and senses the pair of differential signal VSA1, VSA1B and amplifies the result signal of the current mode amplifying with voltage mode, and outputs an amplified data SA0, SA0B. The pre-amplifier 110 and the main-amplifier 120 is enabled in response to a first enable signal EN1 and a second enable signal EN2, respectively. The pair of data line includes a true data line IO and a complementary data line IOB. Also the pair of data line may be directly commonly connected to the pre-amplifier 110 and the main-amplifier 120.

The pre-amplifier 110 of the sense amplifier 100 in FIG. 1 converts the voltage of the pair of data line to have lower and generates the pair of differential signal VSAI, VSAIB using negative impedance converting. That is, the pre-amplifier 110 functions as a voltage level converter and negative impedance converter.

The main-amplifier 120 of the sense amplifier 100 in FIG. 1 senses and amplifies data on the pair of data line through a positive feedback operation with current mode. The main-amplifier 120 receives the pair of differential signal VSA1, VSA1B as common source input signals and amplifies the result signal of the current mode amplifying with voltage mode. That is, the main-amplifier 120 senses and amplifies data on the pair of data line using current mode and voltage mode together.

The sense amplifier 100 in FIG. 1 may have high gain efficiency and low-power consumption because of using voltage mode and current mode together. In addition, the sense amplifier 100 in FIG. 1 may be hardly influenced by the amount of load capacitance of the pair of data line.

Figure 2:
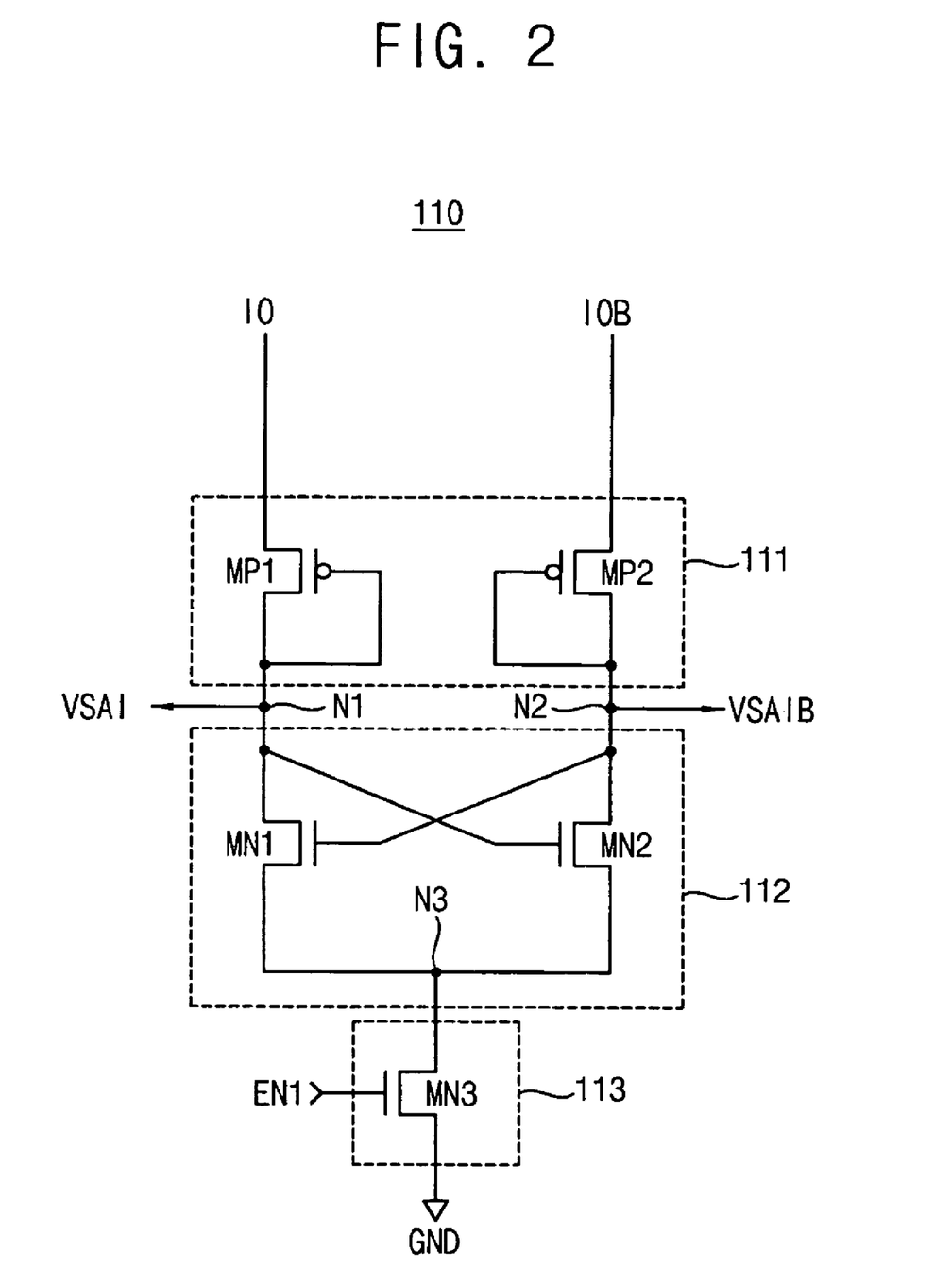
FIG. 2 shows a detail circuit diagram of a pre-amplifier of FIG. 1. in accordance with exemplary embodiment.

FIG. 2 shows a detail circuit diagram of a pre-amplifier of FIG. 1 in accordance with an exemplary embodiment.

Referring to FIG. 2, the pre-amplifier 110 includes a voltage down converter 111, an amplifying part 112 and a switching part 113.

The voltage down converter 111 includes a first diode connected PMOS transistor MP1 and a second diode connected PMOS transistor MP2. The MP1 has a source connected to one of data lines IO and a gate and a drain commonly connected to a first node N1. The MP2 has a source connected to the other of data lines IOB and a gate and a drain commonly connected to a second node N2. That is, the voltage down converter 111 includes diode connected MOS transistors so that it generates an internal voltage to N1 and N2 having common mode voltage lower than the voltage of the data line IO, IOB.

The amplifying part 112 includes a first NMOS MN1 and a second NMOS transistor MN2. The MN1 has a drain connected to the first node N1, a gate connected to the second node N2 and a source connected to a third node N3. The MN2 has a drain connected to the second node N2, a gate connected to the first node N1 and a source connected to the third node N3. That is the amplifying part 112 senses and amplifies the voltage at N1 and N2 and outputs the pair of differential signal VSAI, VSAIB. The transistors MN1, MN2 composing of the amplifying part 112 are cross-coupled connected to each other so that they operate as negative impedance converter. As the voltage of the N2 connected to the gate of MN1 gets higher, the voltage of the N1 gets lower and the impedance of the MN1 gets decreased. As the same way, as the voltage of the N1 connected to the gate of MN2 gets higher, the voltage of the N2 gets lower and the impedance of the MN2 gets decreased.

The switching part 113 includes a third NMOS transistor MN3 between the third node N3 and a reference voltage, like ground voltage GND. The first switching part 113 is enabled in response to the first enable signal EN1 and does as current source. Also the MN3 may be replaced by PMOS transistor depending on active status of the first enable signal EN1.

The pre-amplifier 110 functions as a voltage down converter and negative impedance converter together.

Figure 3:
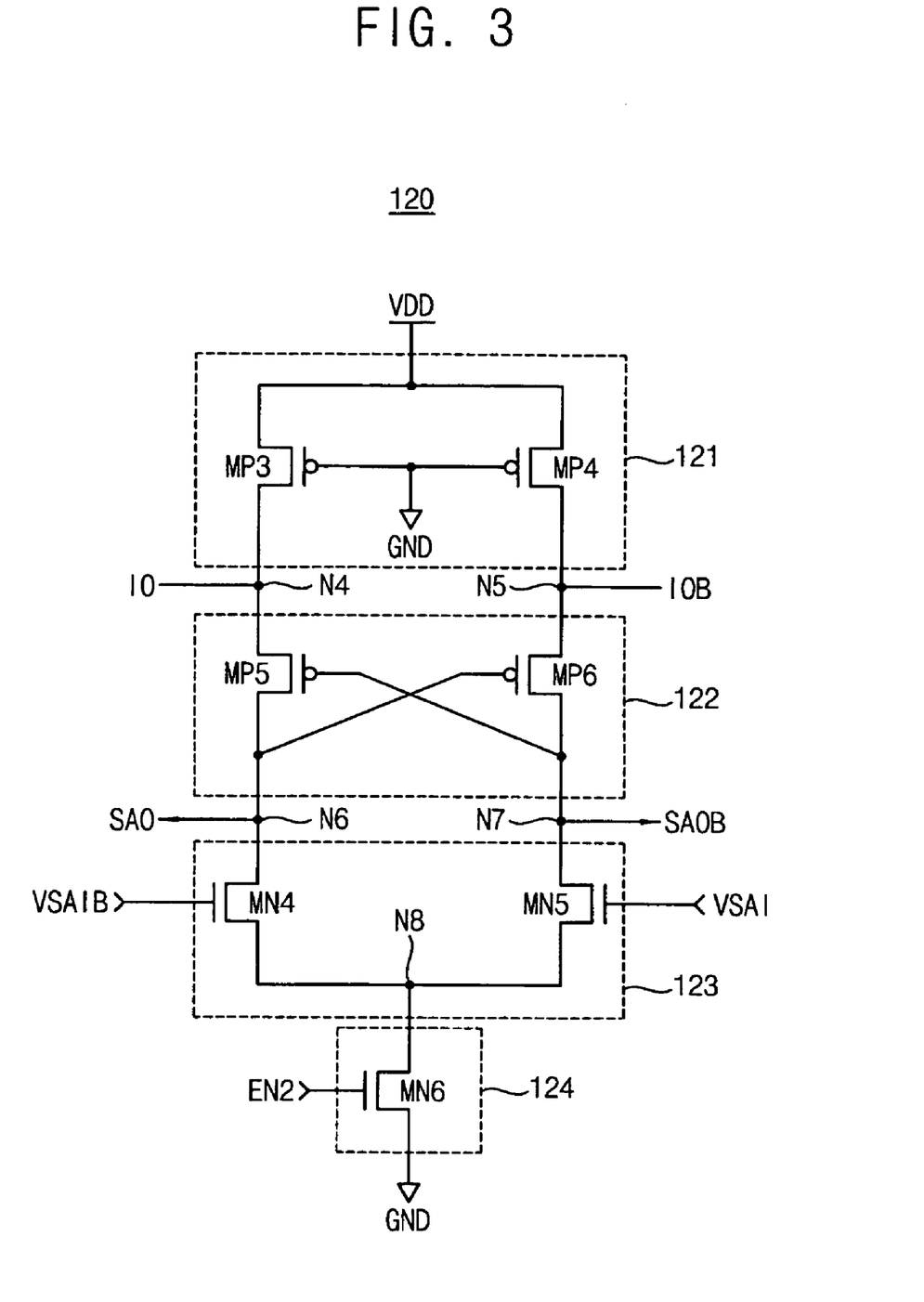
FIG. 3 shows a detail circuit diagram of a main-amplifier of FIG. 1 in accordance with exemplary embodiment.

FIG. 3 shows a detail circuit diagram of a main-amplifier of FIG. 1 in accordance with an exemplary embodiment.

Referring to FIG. 3 the main-amplifier 120 includes a current supplying part 121, a current amplifying part 122, a voltage amplifying part 123, and a switching part 124.

The current supplying part 121 includes current mirror connected transistors including a third PMOS transistor MP3 and a forth PMOS transistor MP4 and supplies current to a fourth node N4 and a fifth node N5. The N4 and the N5 is connected to the IO and the IOB respectively.

The current amplifying part 122 includes cross-coupled connected transistors including a fifth PMOS transistor MP5 and a sixth PMOS transistor MP6. The MP5 has a source connected to the IO, a gate connected to a drain of the MP6 and a drain connected to a gate of the MP6. The MP6 has a source connected to the IOB, a gate connected to the drain of the MP5 and a drain connected to the gate of the MP5. That is, the current amplifying part 123 senses and amplifies data on the data line IO, IOB with current mode through positive feedback operation and outputs a first amplified signal to a sixth node N6 and a seventh node N7.

The voltage amplifying part 123 includes a fourth NMOS transistor MN4 and a fifth NMOS transistor MN5. The MN4 has a drain connected to the N6, a source connected to an eighth node N8, and a gate receiving the VSAIB. The MN5 has a drain connected to the N7, a source connected to the N8, and a gate receiving the VSAI. That is, the voltage amplifying part 123 senses and amplifies first amplified signal in response to the pair of differential signal VSAI, VSAIB as a common source differential amplifier and outputs an amplified data SA0, SA0B. The voltage amplifying part 123 also controls the amount of current of the main-amplifier 120.

The second switching part 124 includes a sixth NMOS transistor MN6 between the third node N8 and a reference voltage, like ground voltage GND, responding to the second enable signal EN2. The first switching part 113 enables in response to the second enable signal EN2 and does as current source. Also the MN6 may be replaced by PMOS transistor according to the second enable signal EN2.

The PMOS transistors of the current amplifying part 122 may be replaced by NMOS transistors if the data line is pre-charged by ground voltage. Also the NMOS transistors of the voltage amplifying part 123 may be replaced by PMOS transistors if the data line is pre-charged by ground voltage.

As explained above, the main-amplifier 120 senses and amplifies data on the pair of data line using current mode and senses and amplifies the result signal of the current mode amplifying using voltage mode and outputs the amplified data SA0, SA0B.

Figure 4:
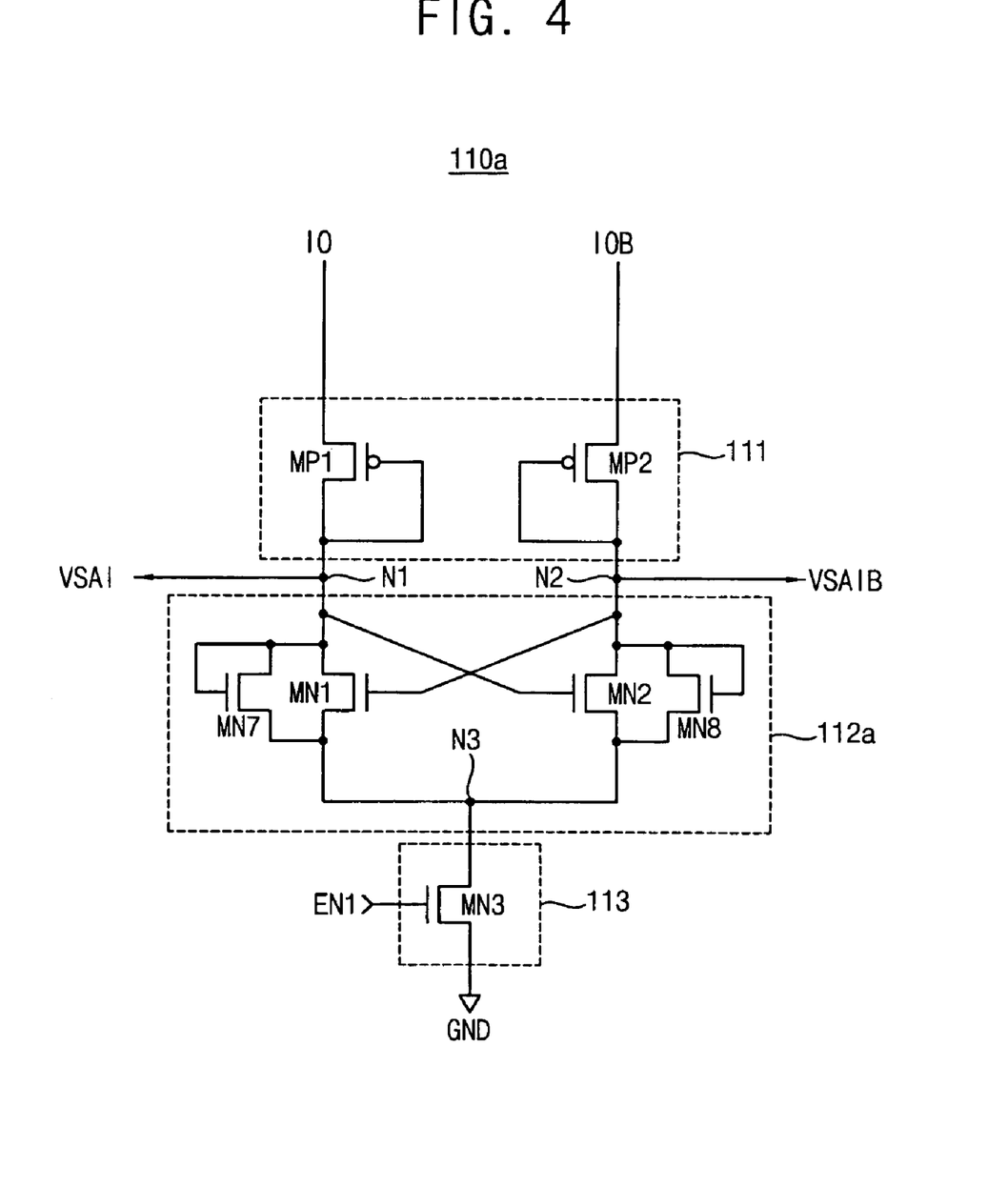
FIG. 4 shows a detail circuit diagram of a pre-amplifier of FIG. 1 in accordance with another exemplary embodiment.

FIG. 4 shows a detail circuit diagram of a pre-amplifier of FIG. 1 in accordance with an exemplary embodiment.

Referring to FIG. 4, the pre-amplifier 110a includes same construction as that of the pre-amplifier 110 of FIG. 2 except that the voltage amplifying part 112a. For the brevity of explanation, only different construction compared to FIG. 2 will be explained hereinafter.

The voltage amplifying part 112a further includes diode connected NMOS transistors MN7 and MN8. The MN7 has a gate and a drain commonly connected to the N1 and a source connected to the N3. The MN8 has a gate and a drain commonly connected to the N2 and a source connected to the N3. The MN7 and the MN8 is respectively connected to the MN1 and MN2 in parallel. The MN7 keeps a maximum voltage between the N1 and the N3 constant. The MN8 keeps a maximum voltage between N2 and N3 constant. So, the pre-amplifier 110a may have an improved noise characteristic by using the diode connected NMOS transistors MN7 and MN8.

Figure 5:
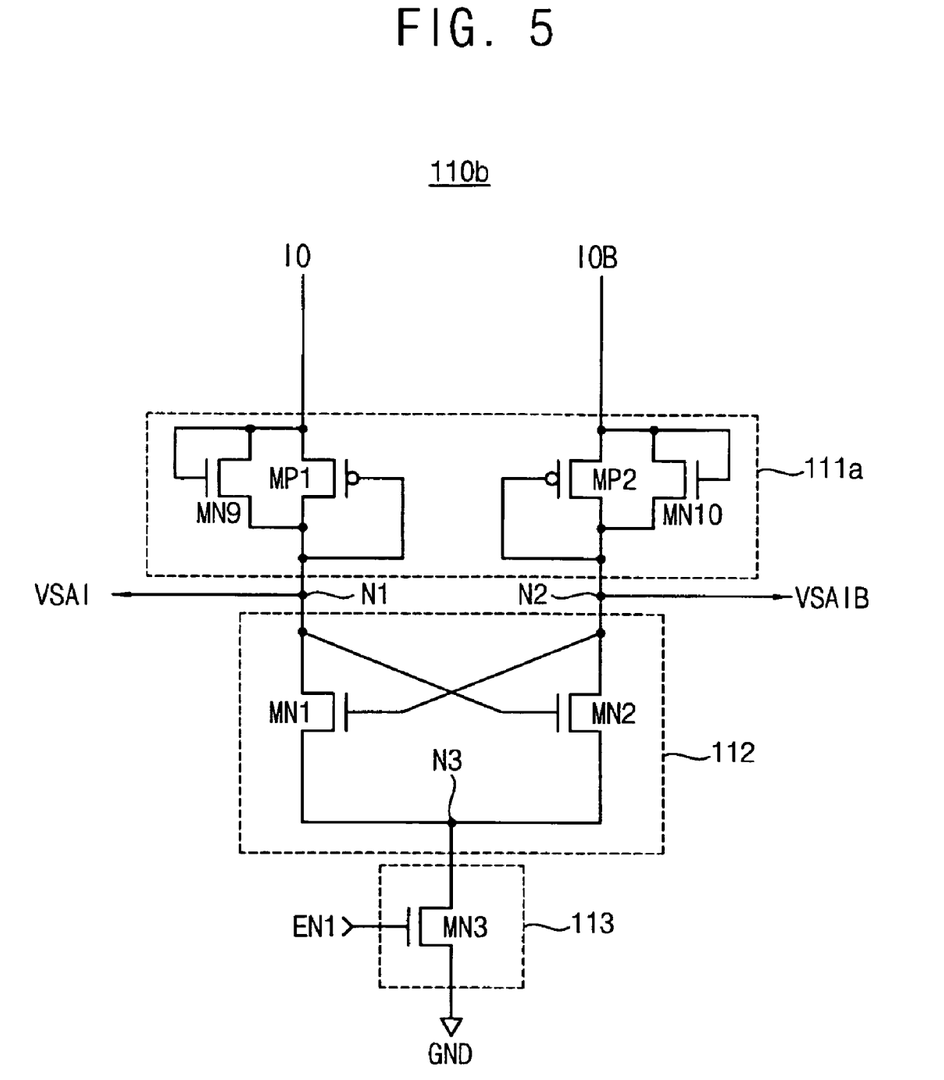
FIG. 5 shows a detail circuit diagram of a pre-amplifier of FIG. 1 in accordance with another exemplary embodiment.

FIG. 5 shows a detail circuit diagram of a pre-amplifier of FIG. 1 in accordance with an exemplary embodiment.

Referring to FIG. 5, the pre-amplifier 110b includes same construction as that of the pre-amplifier 110 of FIG. 2 except that the voltage down converting part 111a. For the brevity of explanation, only different construction compared to FIG. 2 will be explained hereinafter.

The voltage down converting part 111a further includes diode connected MOS transistors MN9 and MN10. The MN9 has a gate and a drain commonly connected to the IO and a source connected to the N1. The MN10 has a gate and a drain commonly connected to the IOB and a source connected to the N2. The MN9 and MN10 is respectively connected to the MP1 and MP2 in parallel. The MN9 and the MP1 become a first CMOS diode and control the threshold voltage of the first CMOS diode adaptively. The MN10 and MP2 become a second CMOS diode and control the threshold voltage of the second CMOS diode adaptively. So, the pre-amplifier 110b may have an improved gain characteristic by using the diode connected NMOS transistors MN9 and MN10.

Figure 6:
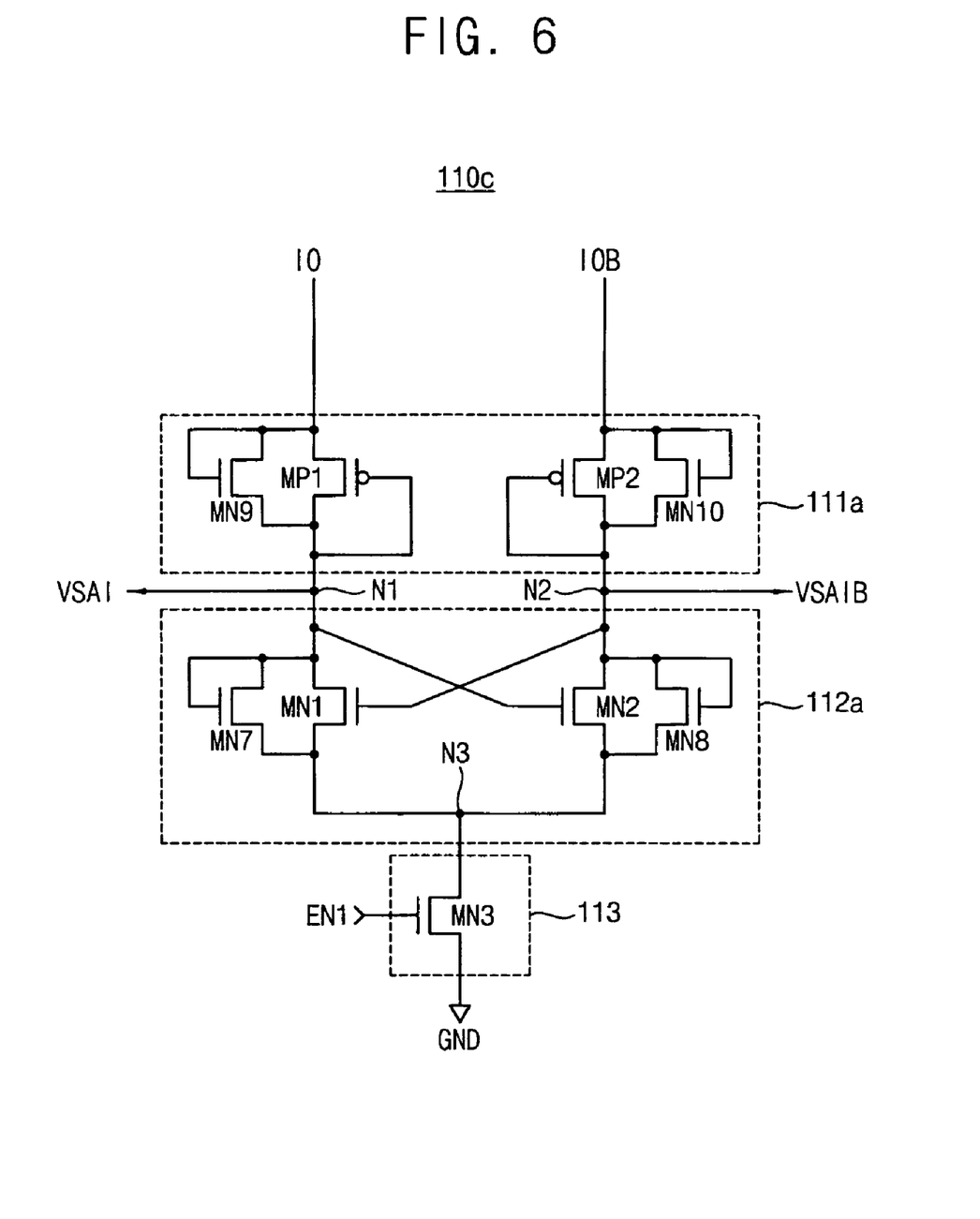
FIG. 6 shows a detail circuit diagram of a pre-amplifier of FIG. 1 in accordance with another exemplary embodiment.

FIG. 6 shows a detail circuit diagram of a pre-amplifier of FIG. 1 in accordance with an exemplary embodiment.

Referring to FIG. 6, the pre-amplifier 110c includes same construction as that of the pre-amplifier 110 of FIG. 2 except that a voltage down converting part 111a and a voltage amplifying part 112a. For the brevity of explanation, only different construction compared to FIG. 2 will be explained hereinafter.

The voltage down converting part 111a and the voltage amplifying part 112a is same as the voltage down converting part 111a of FIG. 5 and the voltage amplifying part 112a of FIG. 4, respectively. So, the pre-amplifier 110c may have an improved gain characteristic and an improved noise characteristic by using the diode connected NMOS transistors MN9, MN10, MN7 and MN8.

Figure 7:
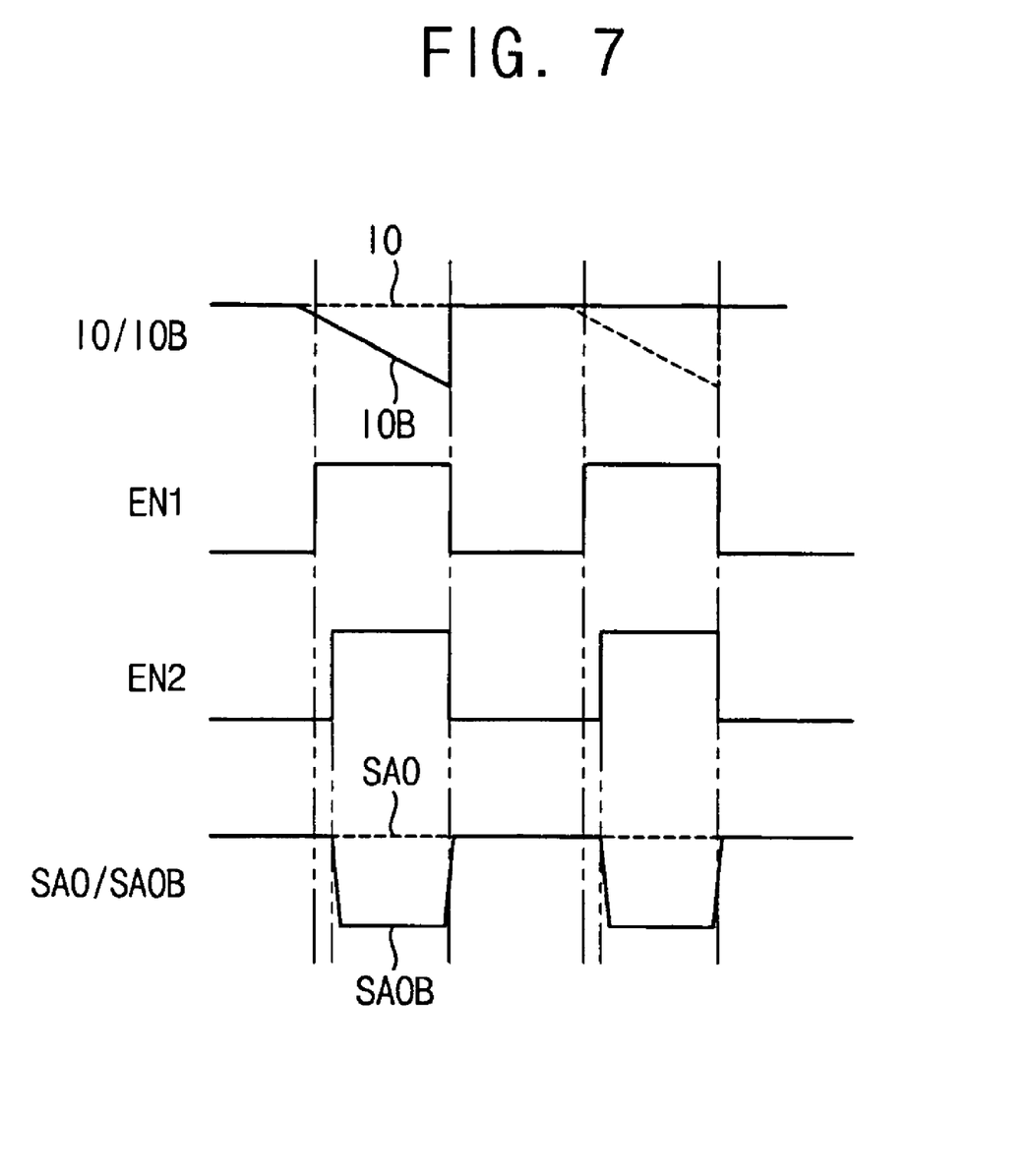
FIG. 7 is a timing diagram showing an operation of a sense amplifier of FIG. 1.

FIG. 7 is a timing diagram showing an operation of a sense amplifier that is explained in above exemplary embodiments.

Referring to FIG. 7, IO and IOB denote voltage signals of the pair of data line respectively, and SA0 and SA0B denote voltage signals of the amplified data of the sense amplifier 100 respectively. EN1 and EN2 denote a voltage signal of a first enable signal EN1 and a second enable signal EN2 respectively. Hereinafter an example will be explained when the sense amplifier 100 senses and amplifies data "1" of data line IO.

Figure 8:
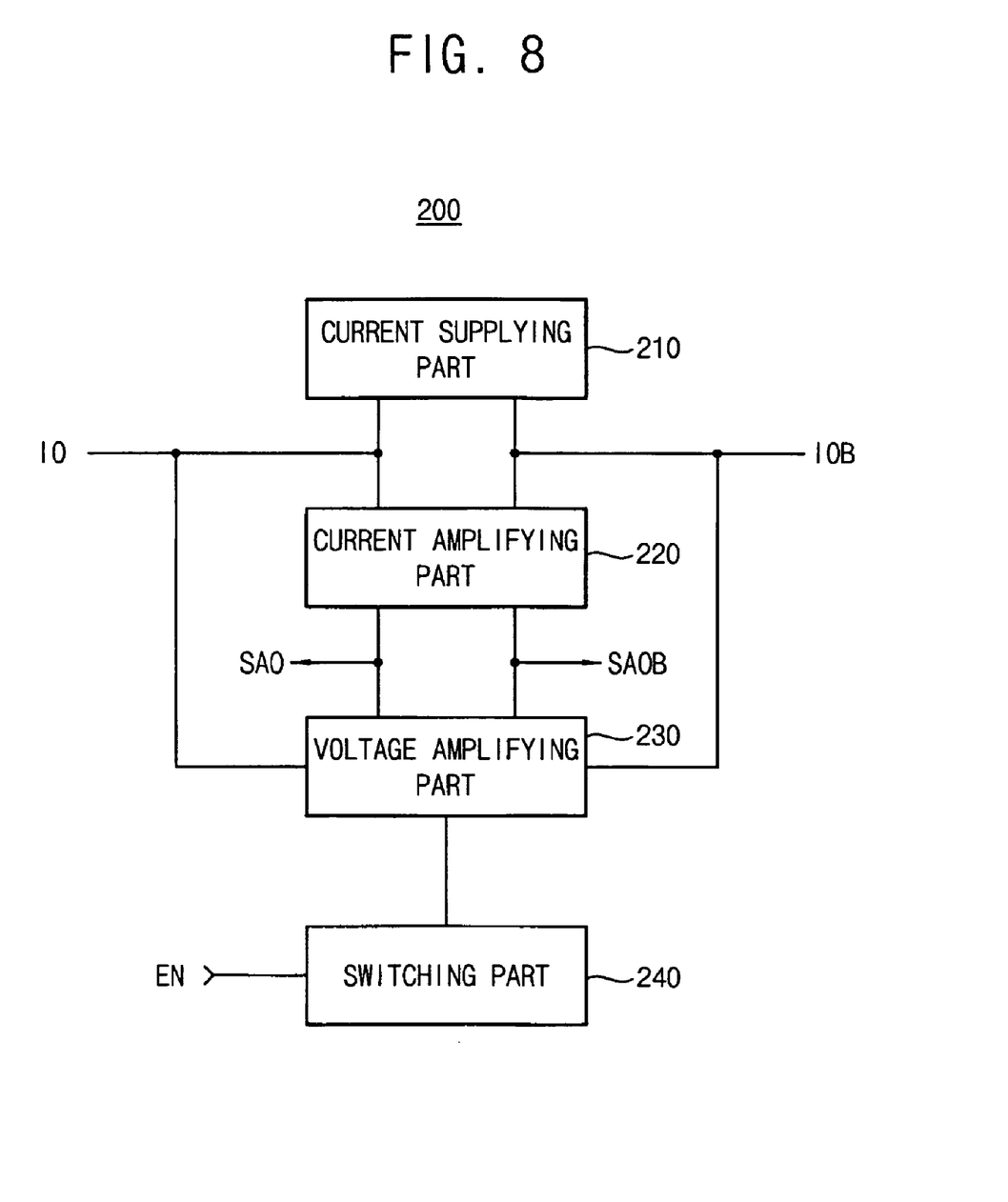
FIG. 8 shows a block diagram of a sense amplifier in accordance with another exemplary embodiment.
Figure 9:
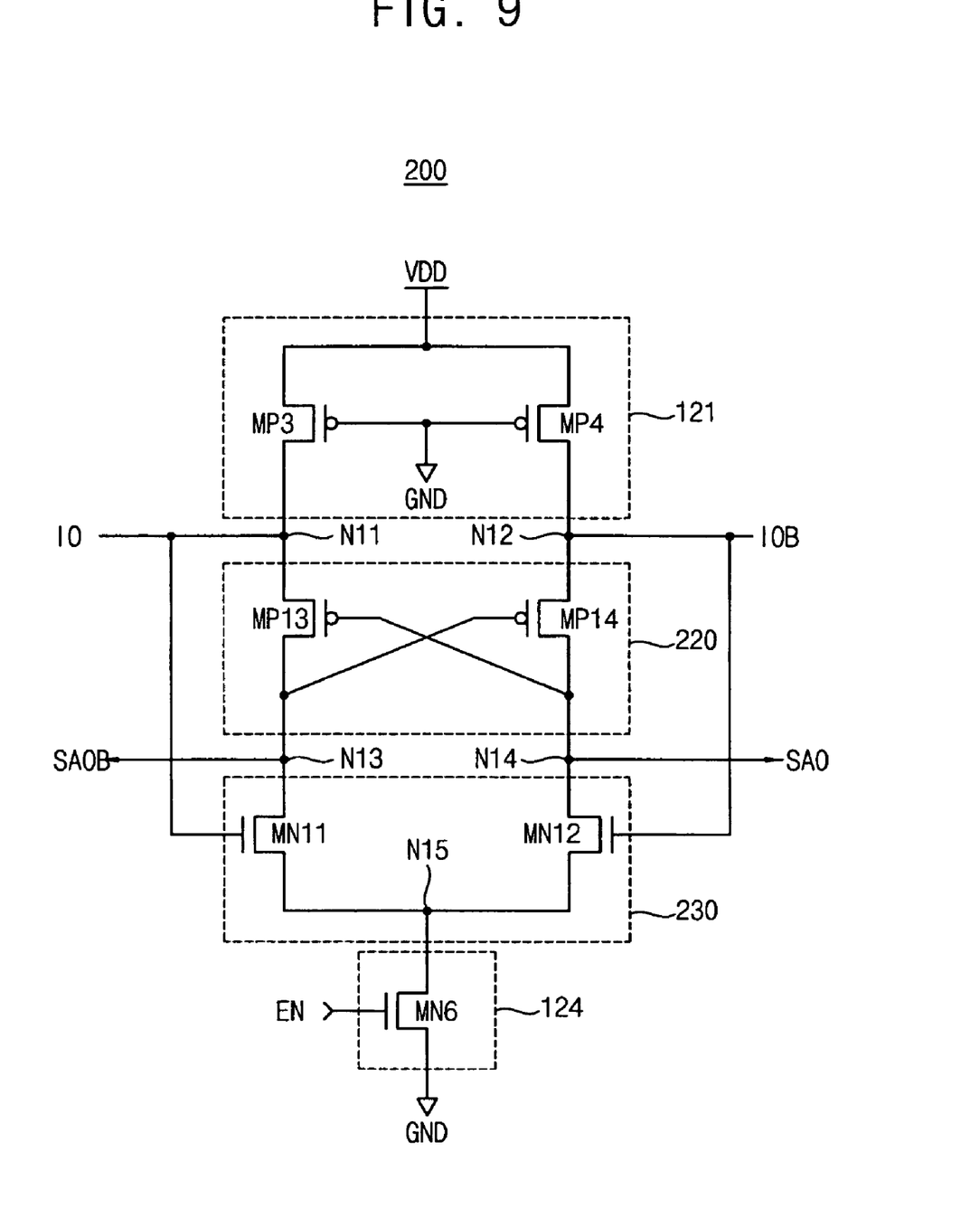
FIG. 9 shows a detail circuit diagram of a sense-amplifier of FIG. 8 in accordance with exemplary embodiment.

The pre-amplifier that may be one of 110, 110a, 110b and 110c starts to sense and amplify data on the data line IO, IOB in response to enabling of the EN1 and outputs the pair of differential signal VSAI, VSAIB to the main-amplifier 120. Soon after then the main-amplifier 120 starts to sense and amplify data on the data line IO, IOB with current mode and the pair of differential signal VSAI, VSAIB with voltage mode in response to enabling of the EN2 and outputs the amplified signal SA0 and SA0B. Each of the SA0 and SA0B has a digital voltage level having high level and low level because the main-amplifier uses current mode sensing operation and voltage mode sensing operation. That is, the sense amplifier may have characteristic having high-speed and low-power consumption FIG. 8 shows a block diagram of a sense amplifier in accordance with an exemplary embodiment. FIG. 9 shows a detail circuit diagram of a sense-amplifier of FIG. 8 in accordance with an exemplary embodiment.

Referring to FIG. 8 and FIG. 9, the sense amplifier 200 includes a current supplying part 210, a current amplifying part 220, a voltage amplifying part 230 and a switching part 240. The explanation of the current supplying part 210 and the switching part 240 will be omitted because the construction and the function of those parts are same as those of FIG. 3.

The current amplifying part 220 includes cross-coupled connected PMOS transistors MP13 and MP14 between a node N11, N12 and a node N13 and a node N14. The node 11 and the node 12 are connected to the IO and the IOB respectively. The MP13 has a source connected to the IO, a gate connected to a drain of the MP14, the N14 and a drain connected to a gate of the MP13, the N13. The MP14 has a source connected to the GIOB, a gate connected to the drain of the MP13, the N13 and a drain connected to the gate of the MP14, the N14. That is, the current amplifying part 230 senses and amplifies data on the pair of data line IO, IOB using current mode through positive feedback operation and outputs a first amplified signal at N13 and N14, like that of current amplifying part 122 of FIG. 3.

The voltage amplifying part 230 includes NMOS transistor MN11 and NMOS transistor MN12. The MN11 has a drain the node N13, a gate connected to the IO, and a source connected to a node N15. The MN14 has a drain the node N14, a gate connected to the IOB and a source connected to the N15. That is, the voltage amplifying part 240 senses and amplifies the first amplified signal in response to data on the pair of data line IO and IOB using voltage mode and outputs an amplified data at N13 and N14.

The sense amplifier 200 may not have a pre-amplifier, like the pre-amplifier of FIG. 2 when a capacitive load of the pair of data line is small enough to operate.

Figure 10:
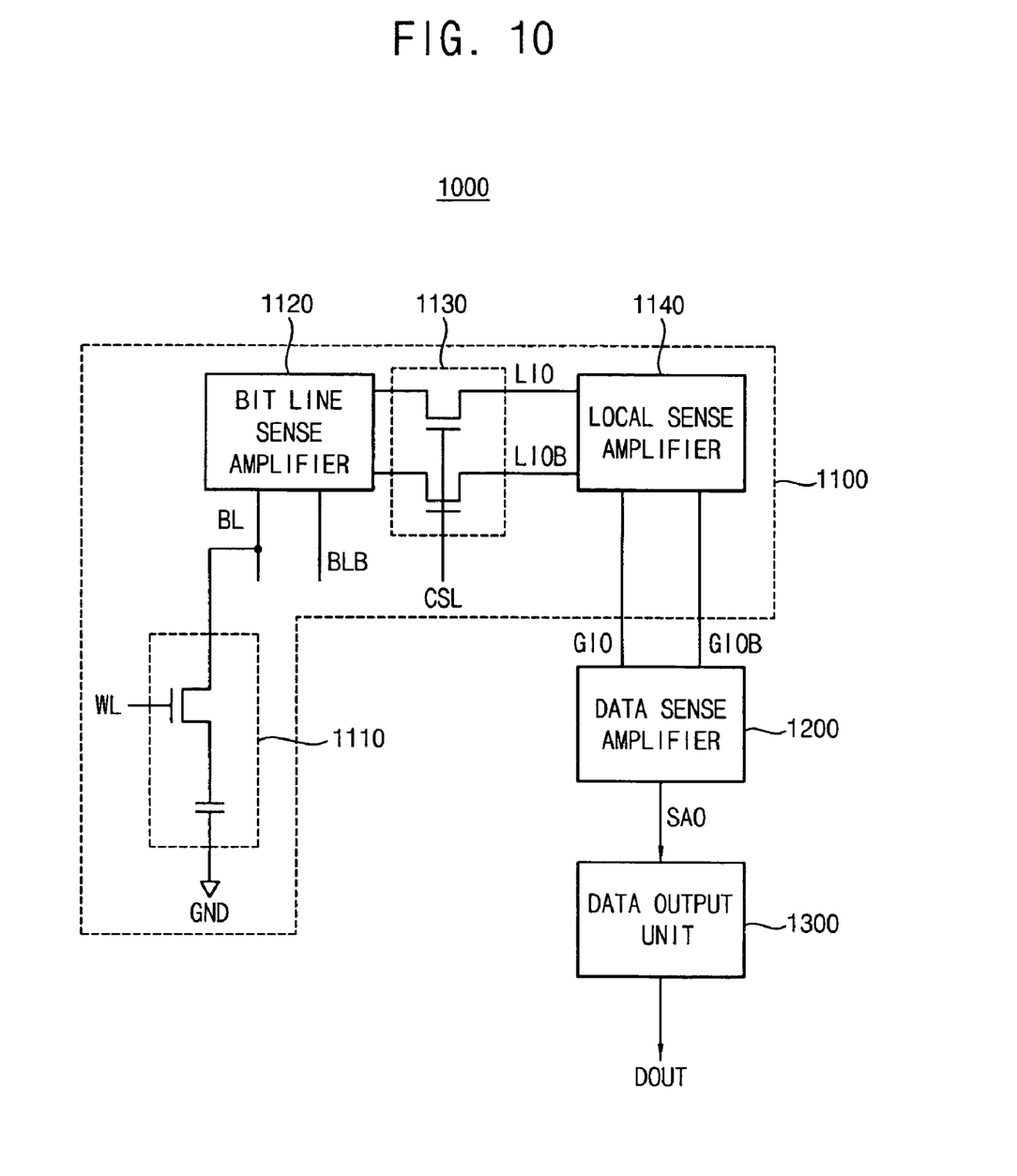
FIG. 10 shows a semiconductor memory device having a sense amplifier of FIG. 1 or FIG. 8 in accordance with exemplary embodiment.

FIG. 10 shows a semiconductor memory device having one of a sense amplifier of FIG. 1 or FIG. 8 in accordance with an exemplary embodiment.

Referring to FIG. 10, the semiconductor memory device 1000 includes a memory core 1100, a data sense amplifier 1200 and a data output unit 1300.

The memory core 1100 includes a memory cell 1110, a bit line sense amplifier 1120, a column selection circuit 1130, and a local sense amplifier 1140. The memory cell 1110 is connected to the bit line sense amplifier 1120 through a pair of bit line BL, BLB. The memory cell 1110 may be one of a volatile memory cell and a non-volatile memory cell. The bit line sense amplifier 1120 is connected to the local sense amplifier 1140 through the column selection circuit 1130 responding to a column selection signal CSL and a pair of local bit line LIO, LIOB. The local sense amplifier 1140 and the data sense amplifier 1200 are connected each other through a pair of global data line GIO, GIOB. The pair of global data line GIO, GIOB is same as the pair of data line IO, IOB in FIG. 1. The data output unit 1300 receives an amplified data signal SA0 from the data sense amplifier 1200 and outputs data signal DOUT to an external device (not shown).

The semiconductor memory device 1000 has a hierarchical data line structure, such as local data line and global data line, to reduce the influence of large load capacitance due to the length of data line.

Figure 11:
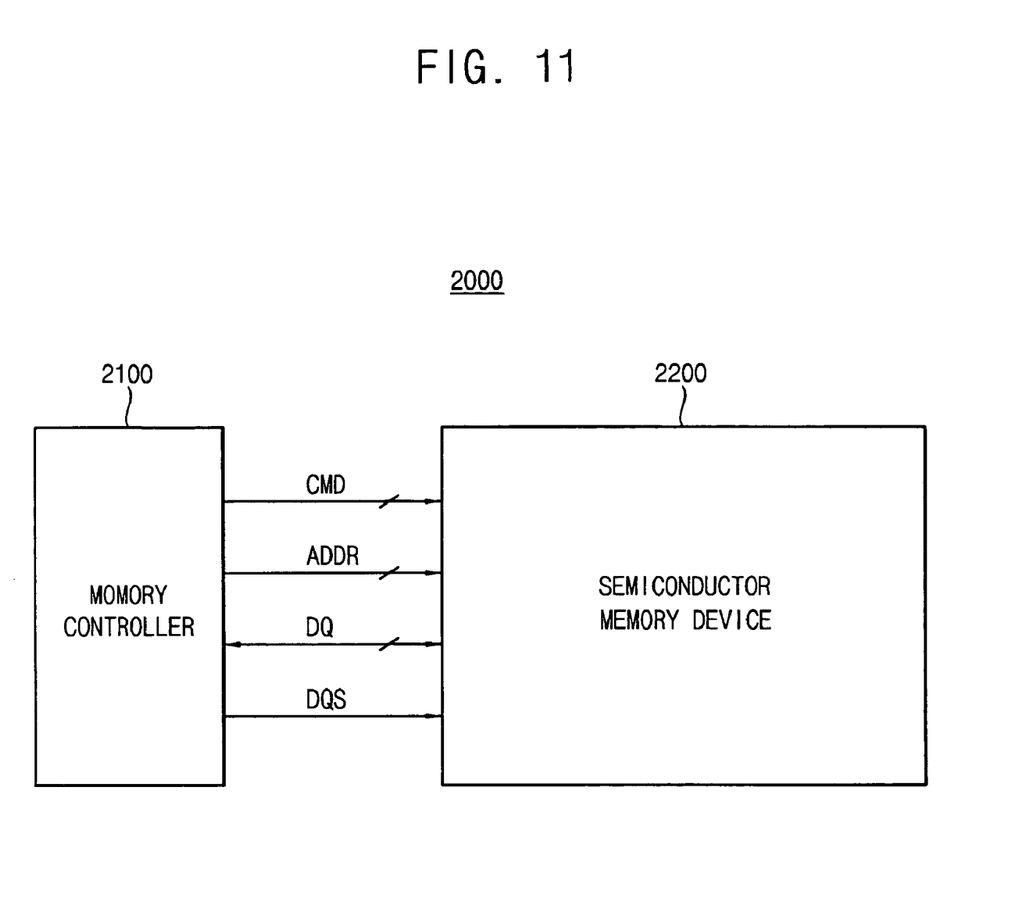
FIG. 11 shows a block diagram of a memory system having a semiconductor memory of FIG. 10.

FIG. 11 shows a block diagram of a memory system having a semiconductor memory device of FIG. 10.

Referring to FIG. 11, the memory system 2000 includes a memory controller 2100 and a semiconductor memory device 2200.

The memory controller generates and sends command signal CMD, address signal ADDR to the semiconductor memory device 2200 and interfaces data strobe signal DQS and data signal DQ with the semiconductor memory device 2200. The semiconductor memory device 2200 outputs/stores data signal DQ in response to the CMD, ADDR, and DQS. The semiconductor memory device 2200 is same as construction of the semiconductor memory device 1000 of FIG. 10 including one of a data sense amplifiers explained above. So, the memory system 2000 may operate faster and have less power consumption.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A sense amplifier comprising:
    a pre-amplifier connected to a pair of data lines and configured to output a pair of differential signals by sensing and amplifying data of the pair of data lines using voltage mode and; and
    a main-amplifier connected to the pair of data lines and configured to generate a first amplified signal by sensing and amplifying data of the pair of data lines using a current mode, and to output a pair of amplified data by sensing and amplifying the first amplified signal using a voltage mode in response to the pair of differential signals, wherein the pre-amplifier and the main-amplifier are independently connected to the pair of data lines.

2. The sense amplifier of claim 1, wherein the pre-amplifier comprises:

a voltage down converting part connected to the pair of data lines and generating internal voltage having lower than the voltage of the pair of data lines; and an amplifying part configured to amplify the internal voltage and outputting the pair of differential signals.

3. The sense amplifier of claim 2, wherein the voltage down converting part includes a first diode connected MOS transistor connected to one of the pair of data lines and a second diode connected MOS transistor connected to the other of the pair of data lines.

4. The sense amplifier of claim 3, wherein the voltage down converting part further includes a third diode connected MOS transistor connected to the first diode in parallel and a forth diode type MOS transistor connected to the second diode in parallel.

5. The sense amplifier of claim 3, wherein the amplifying part includes cross-coupled MOS transistors including a first MOS transistor connected to the first diode connected MOS transistor and a second MOS transistor connected to the second diode connected MOS transistor and output the pair of differential internal signals respectively using a negative impedance converting operation.

6. The sense amplifier of claim 5, wherein the amplifying part further includes a third diode connected MOS transistor connected to the first MOS transistor in parallel and a forth diode connected MOS transistor connected to the second MOS transistor in parallel.

7. The sense amplifier of claim 2, wherein the main-amplifier comprises:

a current supplying part configured to supply to the main-amplifier and the pair of data lines;

a current amplifying part connected to the pair of data lines and generating the first amplified signal by sensing and amplifying the data of the pair of data lines using a current mode; and a voltage amplifying part receiving the pair of differential signals and amplifying the first amplified signal using a voltage mode and outputting the pair of amplified data.

8. The sense amplifier of claim 7, wherein the current amplifying part includes cross-coupled MOS transistors that sense and amplify data on the pair of data lines using current mode with positive feedback operation.

9. The sense amplifier of claim 8, wherein the voltage amplifying part includes MOS transistors that sense the pair of differential signal and amplify the first amplified signal and output the amplified data.

10. The sense amplifier of claim 7, wherein the pre-amplifier further includes a first switching part configured to enable the pre-amplifier and the main-amplifier further includes a second switching part configured to enable the pre-amplifier, the first switching part is enabled faster than the second switching part.

11. A sense amplifier for a pair of first data lines, comprising:

a current amplifying part connected to the pair of first data lines, sensing and amplifying data on the pair of first data lines with current mode and outputting a first amplified signal; and a voltage amplifying part connected to the pair of first data lines, sensing data of the pair of first data lines and amplifying the first amplified signal with voltage mode in response to an external differential signal input and outputting an amplified data, the voltage amplifying part being configured to receive a pair of differential signals externally input from outside the voltage amplifying part and current amplifying part via a pair of second data lines connected to the voltage amplifying part, and to generate the amplified data by amplifying the first amplified signal based on the pair of differential signals, wherein the current amplifying part includes a pair of cross-coupled switching units, and the voltage amplifying part includes no cross-coupled switching units.

12. The sense amplifier of claim 11, further including a current supplying part configured to supply current to the sense amplifier and the pair of data lines.

13. The sense amplifier of claim 11, wherein the current amplifying part includes MOS transistors using positive feedback operation.

14. A semiconductor memory device comprising:

a memory core including at least one memory cell;

a pair of data lines coupled to at least one memory cell;

a sense amplifier connected to the pair of data lines, including a pre-amplifier connected to the pair of data lines and configured to output a pair of differential signals by sensing and amplifying data of the pair of data lines using voltage mode and; and a main-amplifier connected to the pair of data lines and configured to generate a first amplified signal by sensing and amplifying data of the pair of data lines using a current mode, and to output a pair of amplified data by sensing the pair of differential signal and amplifying the first amplified signal using voltage mode, wherein the pre-amplifier and the main-amplifier are independently connected to the pair of data lines.

15. The semiconductor memory device of claim 14, wherein the memory core comprises:

a bit line sense amplifier connected to the memory cell; and a local sense amplifier connected to the bit line sense amplifier through a column selector and a pair of local data line and connected to the sense amplifier through the pair of data line.

16. The semiconductor memory device of claim 15, wherein the pair of data lines is directly connected to the pre-amplifier and the main-amplifier.

* * * * *